United States Patent [19]

Hall et al.

[11] Patent Number: 4,878,988

[45] Date of Patent: Nov. 7, 1989

[54] GETTERING PROCESS FOR SEMICONDUCTOR WAFERS

[75] Inventors: James B. Hall; Martin G. Robinson, both of Chandler; Ronald C. Swift, Mesa, all of Ariz.

[73] Assignee: Motorola, Inc., Schaumburg, Ill.

[21] Appl. No.: 251,734

[22] Filed: Oct. 3, 1988

[51] Int. Cl.$^4$ .............................................. G30B 33/00
[52] U.S. Cl. ........................... 156/600; 156/DIG. 66; 156/DIG. 73; 437/13; 437/939; 437/946
[58] Field of Search ................. 156/DIG. 66, 73, 111, 156/600; 437/10, 11, 12, 13, 241, 939, 946, 977

[56] References Cited

U.S. PATENT DOCUMENTS 4,276,114 6/1981 Takano et al. ...................... 437/977
4,597,822 7/1986 Benjamin et al. .......... 156/DIG. 66

Primary Examiner—John Doll
Assistant Examiner—Mitchell J. Franklin
Attorney, Agent, or Firm—Joe E. Barbee

[57] ABSTRACT

A reduction in the number of impurities present in semiconductor wafers is obtained by gettering the impurities prior to mechanically lapping both wafer surfaces. Damage is created on both surfaces of the semiconductor wafer by the sawing of an ingot into many wafers. The impurities are then gettered to the damaged surfaces by subjecting the wafer to a high temperature. The subsequent lapping operation then removes the damaged regions along with the gettered impurities.

5 Claims, 1 Drawing Sheet

GETTERING PROCESS FOR SEMICONDUCTOR WAFERS

BACKGROUND OF THE INVENTION

This invention relates, in general, to the manufacture of semiconductor devices, and more particularly, to a method of reducing the number of impurities in semiconductor wafers.

Impurities are introduced into semiconductor wafers during the fabrication of the wafers and the fabrication of semiconductor devices on the wafers. The removal of impurities from semiconductor wafers is important in order to prevent the formation of defects, such as oxidation induced stacking faults. Transition metal impurities also cause unfavorable electrical characteristics in the devices, such as high junction leakage.

Several methods have been used to keep impurities away from the active device region on semiconductor wafers. The ability of defects to capture impurities is called gettering. One such gettering technique involves intentionally damaging the back surface of the wafer. Mechanical abrasion, such as lapping or sand blasting, have been used for this purpose. The damage may also be created by a laser beam or ion implantation. The damage creates dislocations in the silicon lattice which represent favorable trapping sites for impurities, such as metallics, and other bulk defects, such as stacking faults.

Another method, called intrinsic gettering, uses oxygen precipitation for trapping sites. Wafers having oxygen concentrations close to the solid solubility are subjected to high temperature which removes oxygen from the surface of the wafer by out-diffusion. The wafers are then annealed at a lower temperature and $SiO_x$ precipitates form in the interior where a saturated amount of oxygen is present. The $SiO_x$ precipitates act as a sink for impurities and defects, thus a denuded or defect-free zone is created near the surface where the semiconductor device is to be fabricated.

Other techniques for gettering include the use of a silicon dioxide or silicon nitride layer grown on the back surface of the semiconductor wafer. These layers are not single crystalline layers, therefore, the polycrystalline grain boundaries act as the trapping sites for impurities. The silicon dioxide or silicon nitride layer is typically lapped off near the end of the processing cycle.

The gettering techniques described above are used during the device processing, therefore, care must be taken not to anneal the damage out during the device processing. If the damage is annealed, the impurities will no longer be trapped and can diffuse throughout the semiconductor wafer. To avoid this, gettering treatments are sometimes applied towards the end of the process cycle. However, at this point the crystalline lattice may already be damaged, and impurities may be located at defects where they are difficult to getter away from. If these impurities were removed before semiconductor processing began, only those impurities introduced during the device manufacture would have to be gettered. In addition, if an epitaxial silicon layer is grown on the wafer, defects from the wafer will propagate to the epitaxial layer. If a defect/impurity free wafer is provided, higher quality epitaxial silicon will be grown, which provides for higher quality semiconductor devices fabricated thereon.

By now it should be appreciated that it would be advantageous to provide a process that not only getters impurities, but removes impurities from the semiconductor wafer.

Accordingly, it is an object of the present invention to provide a process which removes impurities and defects from semiconductor wafers.

Another object of the present invention is to provide a process which provides for improved quality of semiconductor wafers and resultant semiconductor devices.

A further object of the present invention is to provide a gettering process which is easily incorporated into the process flow of fabricating semiconductor wafers.

SUMMARY OF THE INVENTION

In accordance with the present invention, the above and other objects and advantages are provided by gettering and removing impurities during the manufacture of the semiconductor wafers. The surfaces of the wafers are damaged by the sawing of an ingot into wafers. The impurities are then gettered to the damaged surfaces by subjecting wafers to a high temperature step. The lapping operation then removes the damaged material along with the gettered impurities, thus providing a starting semiconductor wafer with a significant amount of impurities removed.

The preferred embodiments of the invention are illustrated in the accompanying drawings for purposes of exemplification, and are not to be construed as limiting in any manner.

DETAILED DESCRIPTION OF THE DRAWINGS

Figure 1:
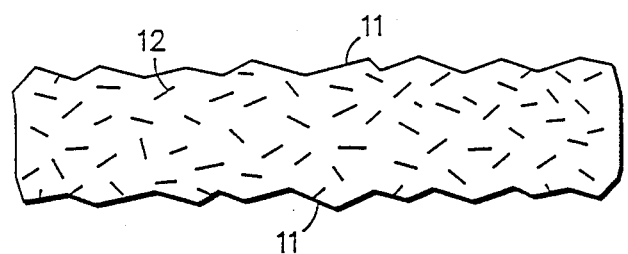
FIGS. 1-4 illustrate the semiconductor wafer during the gettering process of the present invention.

Referring to FIGS. 1-4, a semiconductor wafer is shown during the process embodying the present invention. Semiconductor device manufacture begins by growing a semiconductor crystal or ingot (not shown) by standard techniques well known in the industry. Next, the crystal is sawn with a wire saw or a blade saw to form many semiconductor wafers; a greatly enlarged view of one such wafer 10 is illustrated in FIG. 1. Mechanical damage is created on surfaces 11 of semiconductor wafer 10. Bulk defects and metallic impurities, illustrated as lines 12, are introduced during the crystal growth and during subsequent wafer shaping operations. Note that impurities 12 are distributed throughout semiconductor wafer 10. At this point in the process, the edges of the wafer 10 are rounded to prevent the edges of the wafer 10 from chipping during device fabrication.

Figure 2:
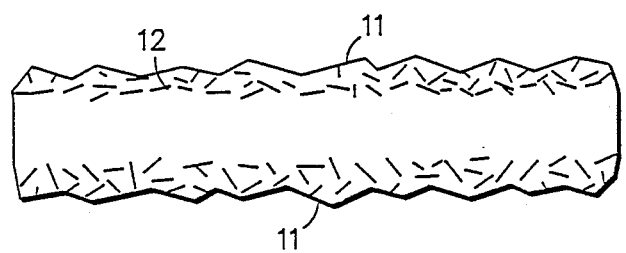

In FIG. 2, wafer 10 is shown after being subjected to a thermal cycle to getter impurities 12 to damaged surfaces 11. In a preferred embodiment, this thermal process entails subjecting the wafer to a temperature of approximately 1000° C. for approximately one hour. The temperature is ramped up from and down to approximately 800° C. in order to avoid warpage of the semiconductor wafers. Other temperatures and times may be used as long as the impurities are gettered to the damaged surfaces.

Figure 3:
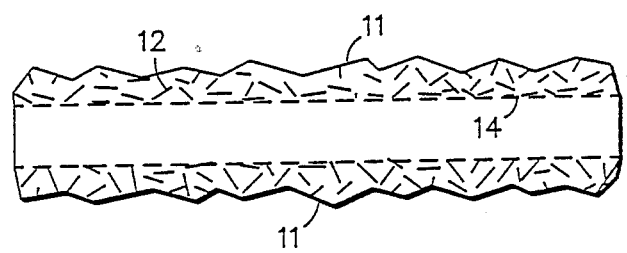

Next, as illustrated in FIG. 3, the wafers are mechanically lapped on both surfaces to obtain a uniform thickness and to improve the wafer flatness. A dashed line 14 is shown to illustrate how much of semiconductor wafer 10 is removed. Typically a thickness of approximately 20 microns is removed. The lapping operation thus removes impurities 12 that have been gettered to damaged surfaces 11. The lapping also creates some damage to the wafer surfaces 11 where impurities can be gettered, thus any impurities introduced from the lapping operation will remain near the surfaces.

Figure 4:
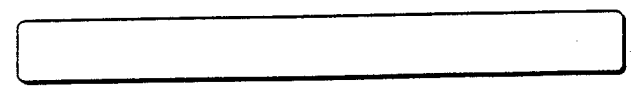

FIG. 4 illustrates wafer 10 after a chemical etch of both surfaces and a mechanical polish of one surface. At this point, further gettering techniques may be used to getter the impurities introduced during the semiconductor device manufacture.

By now it should be appreciated that there has been provided a new and improved process to manufacture semiconductor wafers with a reduction in the amount of impurities present by gettering and removing impurities introduced during the shaping operations of semiconductor wafers.

We claim:

1. A method for removing impurities from a semiconductor wafer having a first and second surface consisting essentially of:
   damaging the first and second wafer surfaces;
   heating the wafer at a predetermined temperature for a amount of time so that the impurities are gettered to the damaged area; and
   removing the damaged area thus removing the gettered impurities.

2. The method of claim 1 wherein the damage is caused by slicing a semiconductor wafer from an ingot.

3. The method of claim 1 wherein the heating is done at a temperature of approximately 1000° C. for approximately one hour.

4. A method for removing impurities from a wafer having a first and second surface consisting essentially of:
   slicing the wafer from an ingot thus creating mechanical damage on the first and second wafer surfaces;
   heating the wafer at a temperature for a amount of time so that impurities are gettered to the damaged area; and
   lapping the damaged area thus removing the gettered impurities.

5. The method of claim 4 wherein the heating is done at a temperature of approximately 1000° C. for approximately one hour.

* * * * *